United States Patent
Zhu et al.

(10) Patent No.: US 10,262,891 B2
(45) Date of Patent: Apr. 16, 2019

(54) SUBSTRATE HAVING TWO SEMICONDUCTOR MATERIALS ON INSULATOR

(71) Applicants: SEMICONDUCTOR MANUFACTURING INTERNATIONAL (SHANGHAI) CORPORATION, Shanghai (CN); NINGBO SEMICONDUCTOR INTERNATIONAL CORPORATION, Ningbo (CN)

(72) Inventors: Ji Guang Zhu, Shanghai (CN); Hai Ting Li, Shanghai (CN)

(73) Assignees: SEMICONDUCTOR MANUFACTURING INTERNATIONAL (SHANGHAI) CORPORATION, Shanghai (CN); NINGBO SEMICONDUCTOR INTERNATIONAL CORPORATION, Ningbo (CN)

( * ) Notice: Subject to any disclaimer, the term of this patent is extended or adjusted under 35 U.S.C. 154(b) by 0 days.

(21) Appl. No.: 15/279,236

(22) Filed: Sep. 28, 2016

(65) Prior Publication Data
US 2017/0125287 A1 May 4, 2017

(30) Foreign Application Priority Data
Nov. 3, 2015 (CN) .......................... 2015 1 0735985

(51) Int. Cl.
*H01L 21/02* (2006.01)
*H01L 21/84* (2006.01)
(Continued)

(52) U.S. Cl.
CPC .. *H01L 21/76254* (2013.01); *H01L 21/02057* (2013.01); *H01L 21/02236* (2013.01);
(Continued)

(58) Field of Classification Search
None
See application file for complete search history.

(56) References Cited

U.S. PATENT DOCUMENTS 5,272,104 A * 12/1993 Schrantz ........... H01L 21/76224
148/DIG. 12
6,380,108 B1 * 4/2002 Linthicum .............. C30B 25/02
257/103

(Continued)

OTHER PUBLICATIONS

Ghyselen et al., Engineering strained silicon on insulator wafers with the Smart Cut™ technology, Solid State Electronics, Elsevier Science Publisher, vol. 48, No. 8, Aug. 1, 2004, pp. 1285-1296.
European Application No. 16196135.4, Extended European Search Report dated Mar. 24, 2017, 11 pages.

*Primary Examiner* — Charles D Garber
*Assistant Examiner* — Xiaoming Liu
(74) *Attorney, Agent, or Firm* — Anova Law Group, PLLC

(57) ABSTRACT

A method for forming a semiconductor device includes forming a first insulator layer on a first substrate of a first semiconductor material, implanting hydrogen ions into the first substrate to form a hydrogen-implanted layer, forming a recessed region in the first substrate, forming a second semiconductor material in the recessed region, and forming a second insulator layer over the second semiconductor material and the first substrate. The method also includes providing a second substrate with a third insulator layer disposed thereon, bonding the first substrate with the second substrate, and removing a lower portion of the first substrate at the hydrogen-implanted layer. A portion of the first substrate is removed to expose a surface of the second semiconductor material in the recessed region, thereby providing a layer of the first semiconductor material adjacent to a layer of the second semiconductor material on the second insulator layer.

20 Claims, 8 Drawing Sheets

(51) Int. Cl.
  *H01L 27/12* (2006.01)
  *H01L 21/762* (2006.01)
  *H01L 21/311* (2006.01)
  *H01L 21/3105* (2006.01)
  *H01L 21/8258* (2006.01)

(52) U.S. Cl.
  CPC .. *H01L 21/02532* (2013.01); *H01L 21/02546* (2013.01); *H01L 21/02636* (2013.01); *H01L 21/31051* (2013.01); *H01L 21/31116* (2013.01); *H01L 21/31144* (2013.01); *H01L 27/1203* (2013.01); *H01L 21/8258* (2013.01); *H01L 21/84* (2013.01)

(56) References Cited

U.S. PATENT DOCUMENTS

| | | | |
|---|---|---|---|
| 8,853,060 B1* | 10/2014 | Lai | H01L 21/02532 |
| | | | 438/478 |
| 2005/0054175 A1* | 3/2005 | Bauer | H01L 21/02381 |
| | | | 438/404 |
| 2006/0172505 A1 | 8/2006 | Koester et al. | |
| 2007/0202635 A1* | 8/2007 | Ellis-Monaghan | |
| | | | H01L 21/76264 |
| | | | 438/149 |
| 2011/0163410 A1* | 7/2011 | Signamarcheix | |
| | | | H01L 21/76254 |
| | | | 257/506 |

* cited by examiner

SUBSTRATE HAVING TWO SEMICONDUCTOR MATERIALS ON INSULATOR

CROSS-REFERENCES TO RELATED APPLICATIONS

This application claims priority to Chinese patent application No. 201510735985.7, filed on Nov. 3, 2015, the content of which is incorporated herein by reference in its entirety.

BACKGROUND OF THE INVENTION

The present invention relates to the field of semiconductor technology. Specifically, embodiments of the invention are directed to semiconductor substrate structures, devices, and manufacturing methods.

Currently, gallium arsenide (GaAs) is often used in advanced CMOS devices and bipolar devices, because compared to pure silicon (Si), GaAs can provide a higher hole mobility. Similar to the GaAs, silicon germanium (SiGe) is often used for advanced CMOS devices and bipolar devices, because SiGe can also provide higher mobility of holes. In addition, RF (Radio Frequency) devices often require high insulating properties. Therefore, SOI (silicon on insulator) wafers are being using widely in RF applications.

BRIEF SUMMARY OF THE INVENTION

Embodiments of the present invention provide methods for forming substrate structures that include regions of different semiconductor materials on an insulator. The different semiconductor materials can be single crystalline materials, and can include silicon, SiGe, and GaAs, etc. Bipolar or CMOS devices having high mobilities can be formed in these substrate structures. For example, PNP bipolar devices and PMOS transistors can be formed in regions of SiGe or GaAs to obtain higher hole mobilities. Low power devices or RF devices can be formed in the silicon regions. In addition, the semiconductor regions are formed on insulators, providing the advantages of SOI, such as better insulation and reduced short channel effects.

According to some embodiments of the present invention, a method for forming a semiconductor device includes forming a first insulator layer on a first substrate of a first semiconductor material, implanting hydrogen ions into the first substrate to form a hydrogen-implanted layer that divides the first substrate into an upper portion and a lower portion, and removing a portion of the first insulating layer and the first substrate to form a recessed region in the first substrate. The method also includes forming a second semiconductor material in the recessed region by selective epitaxial growth, and forming a second insulator layer over the second semiconductor material and the first substrate. The method further includes providing a second substrate with a third insulator layer disposed thereon, bonding the first substrate with the second substrate with the second insulator layer adjacent to the third insulator layer, and removing the lower portion of the first substrate at the hydrogen-implanted layer. A portion of the first substrate is removed to expose a surface of the second semiconductor material in the recessed region, thereby providing a layer of the first semiconductor material on the second insulator layer adjacent to a layer of the second semiconductor material on the second insulator layer.

In an embodiment of the above method, the recessed region is in the top portion of the first substrate above the hydrogen-implanted layer.

In an embodiment, the recessed region extends into a top portion of the hydrogen-implanted layer.

In an embodiment, forming the recessed region includes forming a patterned photoresist layer on the first insulator layer, using the patterned photoresist as a mask to remove a portion of the first insulating layer and the first substrate to form the recessed region in the first substrate, and removing the photoresist layer.

In an embodiment, the method also includes performing a surface cleaning treatment before forming the second semiconductor material in the recessed region by selective epitaxial growth.

In an embodiment, the surface cleaning treatment includes photoresist ashing and removal, and wet cleaning steps.

In an embodiment, the first semiconductor material is silicon (Si) and the second semiconductor material is gallium arsenide (GaAs).

In an embodiment, the first semiconductor material is silicon (Si) and the second semiconductor material is silicon germanium (SiGe).

In an embodiment, the method also includes planarizing the second insulator layer over the second semiconductor material and the first substrate.

In an embodiment, providing the second substrate with the third insulator layer includes forming a polysilicon layer on the second substrate and oxidizing the polysilicon layer to form the third insulator layer.

In an embodiment, the second semiconductor material is silicon germanium (SiGe), and the method also includes forming a silicon cap layer on the second semiconductor layer, oxidizing a portion of the silicon cap layer to form a silicon dioxide layer, and depositing the second insulator layer on the first insulator layer and the silicon dioxide layer.

According to another embodiment of the present invention, a semiconductor substrate structure includes a substrate, an insulator layer on the substrate, and a layer of a first semiconductor material on the insulator layer adjacent to a layer of a second semiconductor material on the insulator layer.

In an embodiment, the first semiconductor material is different from the second semiconductor material.

In an embodiment, the first semiconductor material and the second semiconductor material are single crystalline materials.

In an embodiment, the first semiconductor material is silicon (Si) and the second semiconductor material is gallium arsenide (GaAs).

In an embodiment, the first semiconductor material is silicon (Si) and the second semiconductor material is silicon germanium (SiGe).

In an embodiment, the thickness of the insulator layer is between 1,000 to 20,000 Å.

In an embodiment, the substrate structure also includes a polysilicon layer between the insulator layer and the substrate.

In an embodiment, the second semiconductor layer is SiGe, and the substrate includes a silicon cap layer disposed between the second semiconductor layer and the insulator layer.

According to another embodiment of the invention, a semiconductor apparatus includes a substrate, an insulator layer on the substrate, and a layer of a first semiconductor material on the insulator layer adjacent to a layer of a second semiconductor material on the insulator layer. The semiconductor apparatus also includes a first semiconductor device formed in the layer of the first semiconductor material, and a second semiconductor device formed in the layer of the second semiconductor material.

The following description, together with the accompanying drawings, will provide further understanding of the nature and advantages of the claimed invention.

DETAILED DESCRIPTION OF THE INVENTION

Figure 1A:
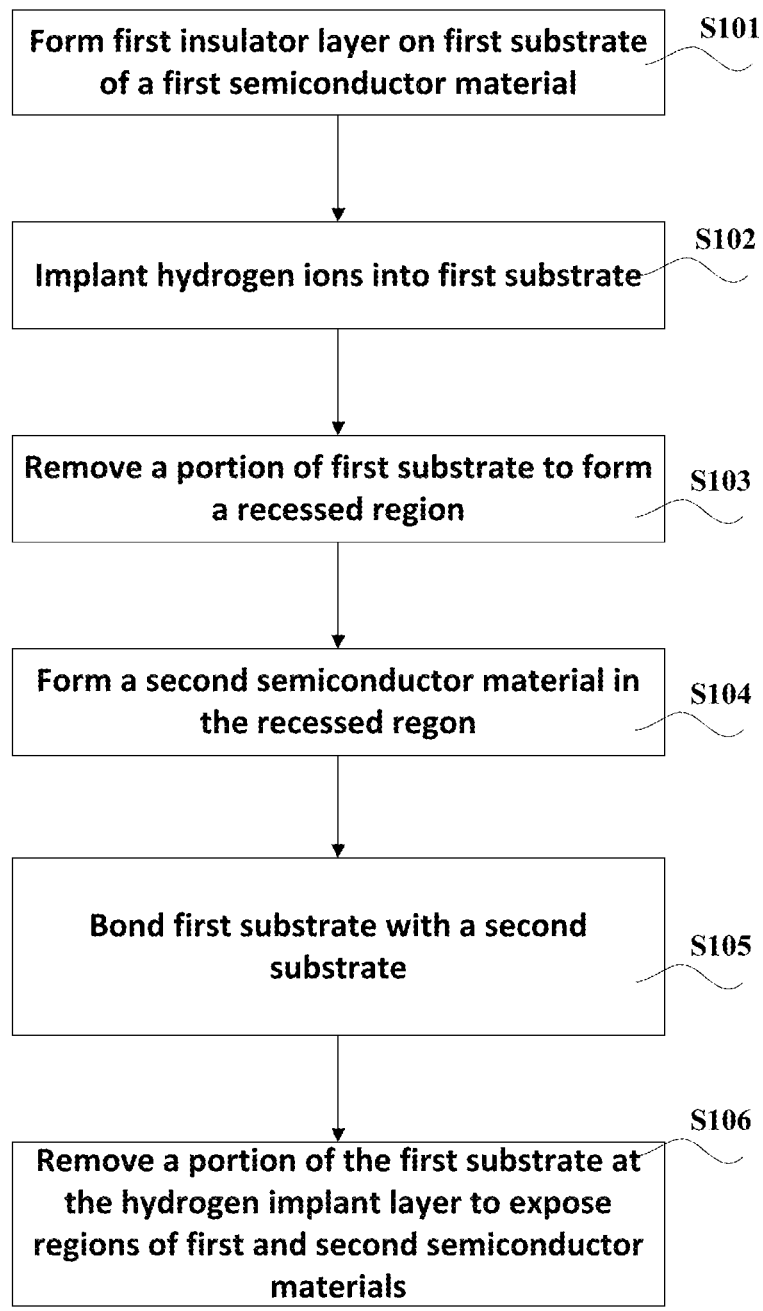
FIG. 1A is a simplified flow chart of a method for forming a semiconductor device according to an embodiment of the present invention.

Exemplary embodiments of the present invention will be described with reference to the figures. The following description of exemplary embodiments is illustrative only, and not intended to be any limitation on the invention and its application or use. It is understood that the relative arrangement of parts and steps and numeric expressions set forth in these embodiments are not to be construed as limiting the scope of the invention. It is also understood that, for convenience of description, the size of the various components shown in the drawings are not necessarily drawn in actual proportional relationship. Techniques, methods and devices known to one of ordinary skill in the relevant art may not be discussed in detail, but in situations in which these techniques, methods and apparatus apply, these techniques, methods and apparatus should be considered as part of this specification. Further, similar reference numerals and letters are used to refer to similar items in the following figures, and once an item is defined in one of the figures, it will not need to be explained further in the subsequent figures.

FIG. 1A is a simplified flow chart of a method for forming a semiconductor device according to an embodiment of the present invention. As shown in FIG. 1, the method can be summarized as follows:

Step S101: Form a first insulator layer on a first substrate of a first semiconductor material;

Step S102: Implant hydrogen ions into the first substrate to form a hydrogen-implanted layer that divides the first substrate into an upper portion and a lower portion;

Step S103: Remove a portion of the first insulating layer and the first substrate to form a recessed region in the first substrate;

Step S104: Form a second semiconductor material in the recessed region by selective epitaxial growth;

Step S105: Bond the first substrate with a second substrate; and

Step S106: Remove a lower portion of the first substrate at the hydrogen-implanted layer, thereby providing a layer of the first semiconductor material on the second insulator layer adjacent to a layer of the second semiconductor material on the second insulator layer.

Figure 1B:
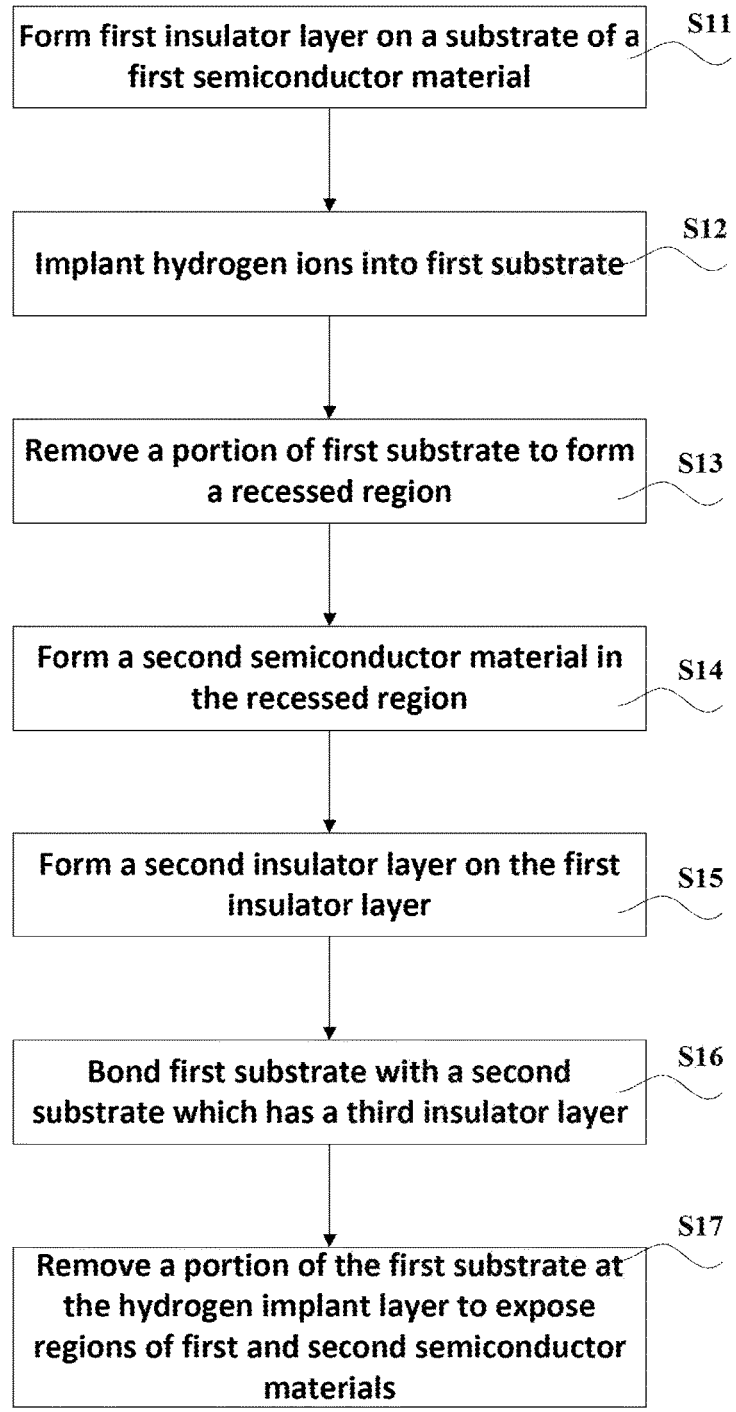
FIG. 1B is a simplified flow chart of a method for forming a semiconductor device according to another embodiment of the present invention.

FIG. 1B is a simplified flow chart of a method for forming a semiconductor device according to another embodiment of the present invention. FIGS. 2A-2I are cross-sectional view diagrams illustrating various stages of the method for forming a semiconductor device according to an embodiment of the present invention. The following description refers to the process steps in flowchart in FIG. 1B and the view diagrams in FIGS. 2A-2I.

Figure 2A:
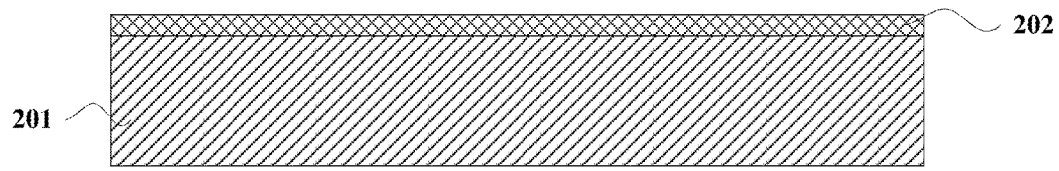
FIG. 2A is a cross-sectional view diagram illustrating a stage of a method for forming a semiconductor device according to embodiments of the present invention.

At step S11, as shown in FIG. 2A, a first insulator layer 202 is formed on a first substrate 201 of a first semiconductor material. In this embodiment, substrate 201 can include a semiconductor material, for example, a silicon substrate or a silicon-on-insulator substrate (SOI), etc. First insulator layer 202 can be formed by oxidation or deposition, and can include a silicon oxide ($SiO_2$), a silicon nitride (SiN, more generally, SixNy), silicon nitride oxide, or silicon oxynitride (SiOxNy), or silicon carbonitride (SiCN), etc.

Figure 2B:
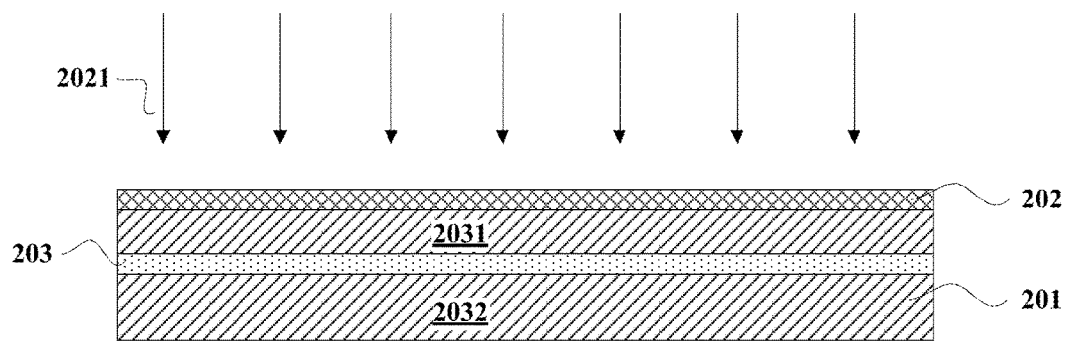
FIG. 2B is a cross-sectional view diagram illustrating a stage of the method for forming a semiconductor device according to embodiments of the present invention.

At step S12, as shown in FIG. 2B, hydrogen ions 2021 are implanted into first substrate 201 to form a hydrogen-implanted layer 203 that divides the first substrate into an upper portion 2031 and a lower portion 2032. Hydrogen-implanted layer 203 is at a predefined distance below the surface of first substrate 201, which can vary depending on the embodiment. In some embodiments, the Smart Cut process can be used to perform the hydrogen implant.

Figure 2C:
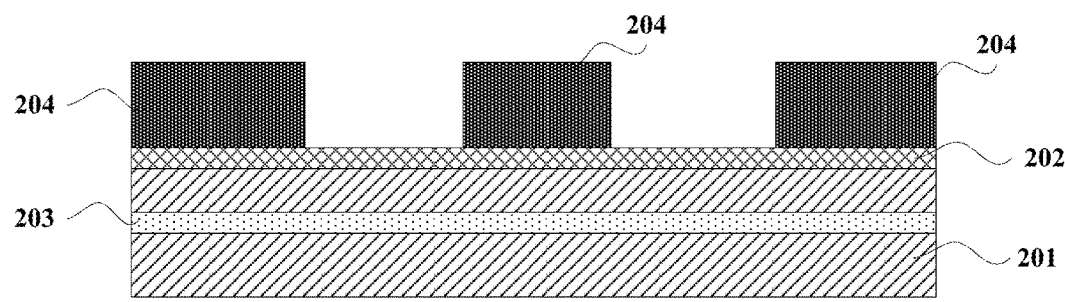
FIG. 2C is a cross-sectional view diagram illustrating a stage of the method for forming a semiconductor device according to embodiments of the present invention.
Figure 2D:
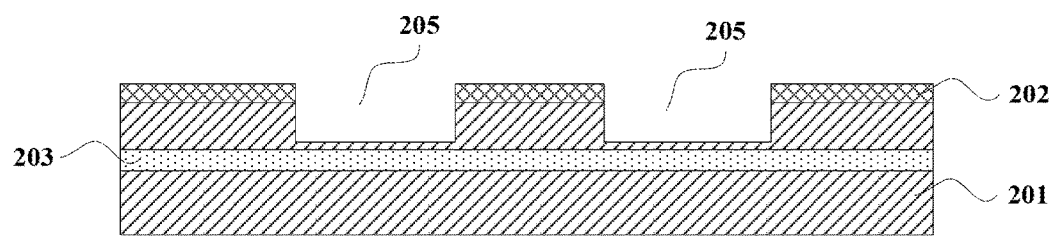
FIG. 2D is a cross-sectional view diagram illustrating a stage of the method for forming a semiconductor device according to embodiments of the present invention.

At step S13, as shown in FIG. 2D, a portion of the first insulating layer 202 and the first substrate are removed to form a recessed region 205 in the first substrate. First, as shown in FIG. 2C, a patterned mask, e.g., a photoresist layer, 204 is formed on first insulating layer 202. An etching process can be used to form recess regions 205, and mask layer 204 can be removed. In some embodiments, the bottom of the recessed region 205 is positioned above the hydrogen implanted layer 203, as shown in FIG. 2D. This facilitates a subsequent step, in which the hydrogen implanted layer 203 is used to separate the silicon substrate. The bottom of the recessed region 205 may be located above the hydrogen injection layer 203 by a certain distance or may be just on the surface in contact with hydrogen implanted layer 203. Alternatively, the bottom of recessed region 205 can be within hydrogen implanted layer 203.

Figure 2E:
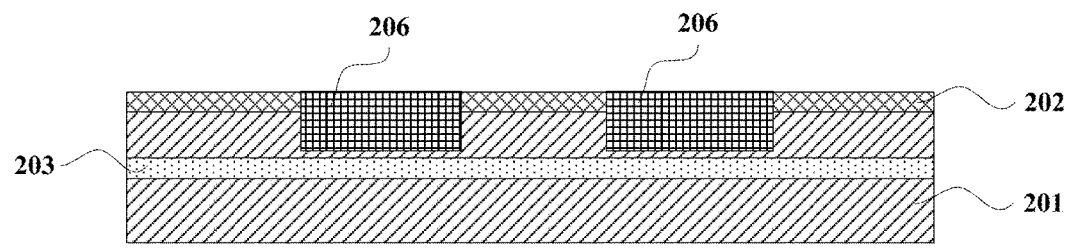
FIG. 2E is a cross-sectional view diagram illustrating a stage of the method for forming a semiconductor device according to embodiments of the present invention.

At step S14, as shown in FIG. 2E, a second semiconductor material 206 is in recessed regions 205. For example, second semiconductor material 206 can be formed by selective epitaxial growth. In this case, a single crystalline semiconductor material 206 is formed in the recessed region. Second semiconductor material 206 can be GaAs or SiGe, or other compound semiconductor materials. Selective epitaxial growth of GaAs or SiGe can be carried out by adjusting the type of depositing gas (such as $SiH_2Cl_2$) and reactive etching gas (e.g. HCl), such that the growth only takes place on the silicon surface, and there is no growth in the first insulator layer (oxide layer may be, e.g., silicon dioxide).

In some embodiments, prior to the formation of the second semiconductor material, a surface cleaning treatment is performed on the first insulator layer and the silicon substrate after etching. For example, the surface cleaning treatment may include: photoresist ashing removal (if used photoresist in step S13) and wet cleaning. In other embodiments where the photoresist is not used in step S13 or where the photoresist has been removed, the surface cleaning processing may include wet cleaning. For example, the wet cleaning may include: CR cleaning, RCA cleaning, and ultrasonic cleaning after the hydrofluoric acid treatment process (also known as HF last clean). In the above embodiment, the silicon surface cleaning treatment can make the surface clean and free of C, O and other ingredients (here, the amount of corrosion of the insulator by the HF last cleaning can be controlled to be small, and will not cause significant first changes).

Figure 2F:
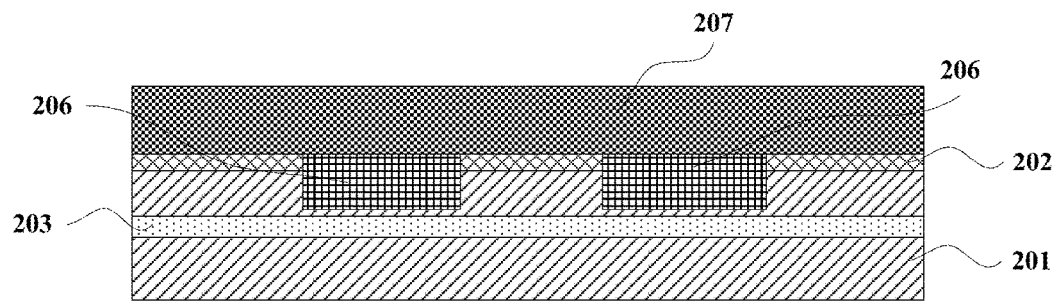
FIG. 2F is a cross-sectional view diagram illustrating a stage of the method for forming a semiconductor device according to embodiments of the present invention.

At step S15, as shown in FIG. 2F, a second insulator layer 207 is formed over the second semiconductor material and the first substrate. For example, the second insulating layer may be silicon dioxide. The thickness range of the second insulator layer may be 0 Å to 10000 Å. In other words, in some embodiments, the second insulator layer may be absent.

Figure 2G:
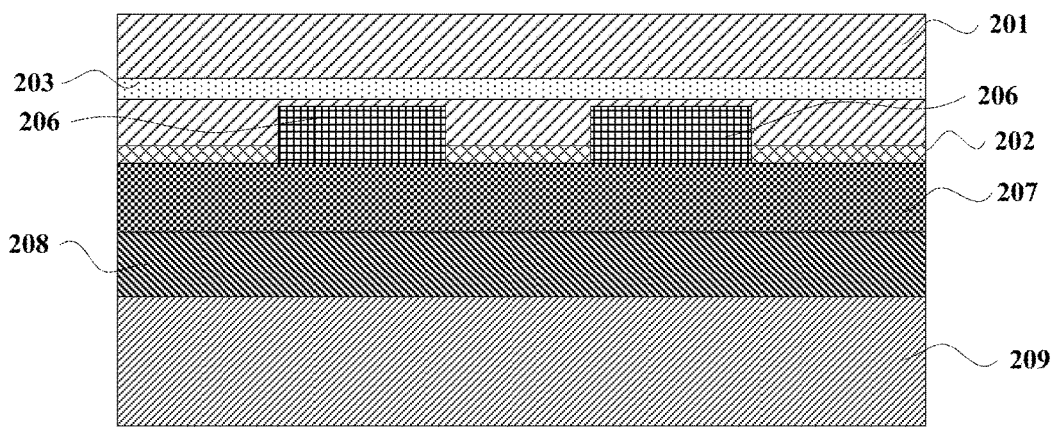
FIG. 2G is a cross-sectional view diagram illustrating a stage of the method for forming a semiconductor device according to embodiments of the present invention.
Figure 3A:
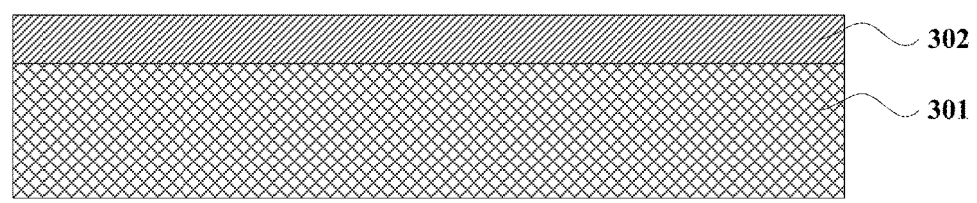
FIG. 3A is a cross-sectional view diagram illustrating a stage of the method for forming a semiconductor device according to another embodiment of the present invention.
Figure 3B:
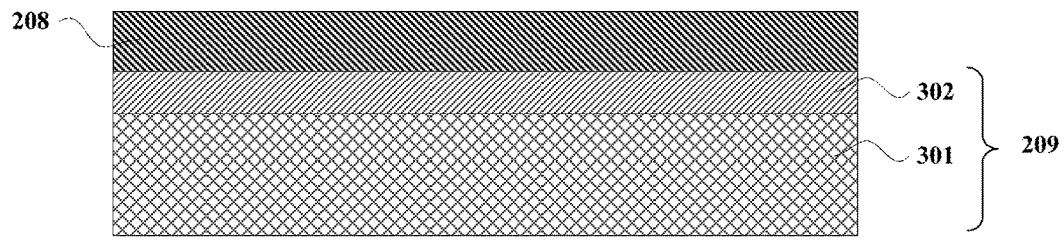
FIG. 3B is a cross-sectional view diagram illustrating a stage of the method for forming a semiconductor device according to another embodiment of the present invention.

At step S16, as shown in FIG. 2G, the first substrate is bonded with a second substrate 209, which has a third insulator layer 208 disposed thereon. As can be seen in FIG. 2G, the second insulator layer 207 is adjacent to and bonded with the third insulator layer 208. The second substrate 209 is used as a support substrate or a handle substrate, which is bonded to the device structure shown in FIG. 2F based on the first substrate. Depending on the embodiments, second substrate 209 can be a silicon substrate or a silicon substrate having a polysilicon layer formed thereon. FIGS. 3A and 3B illustrate a method for forming a silicon substrate having a polysilicon layer formed thereon. In other embodiments, a second insulator layer is not formed, but the third insulating layer is bonded to the first insulator layer and the semiconductor layer. In this case, the third insulating layer is formed on the back of the substrate, e.g. as shown in FIG. 1A.

In some embodiments, the thickness of the second insulating layer and the third layer of insulating material can range from 1000 Å to 20000 Å. In some embodiments, before the third insulating layer and the second insulating layer are bonded, the second insulating layer 207 may be planarized. For example, after the formation of the second insulating layer 207, it can be planarized by a CMP (Chemical Mechanical Polishing or Planarization) process. The planarization can allow the bonding to be engaged more closely.

Figure 2H:
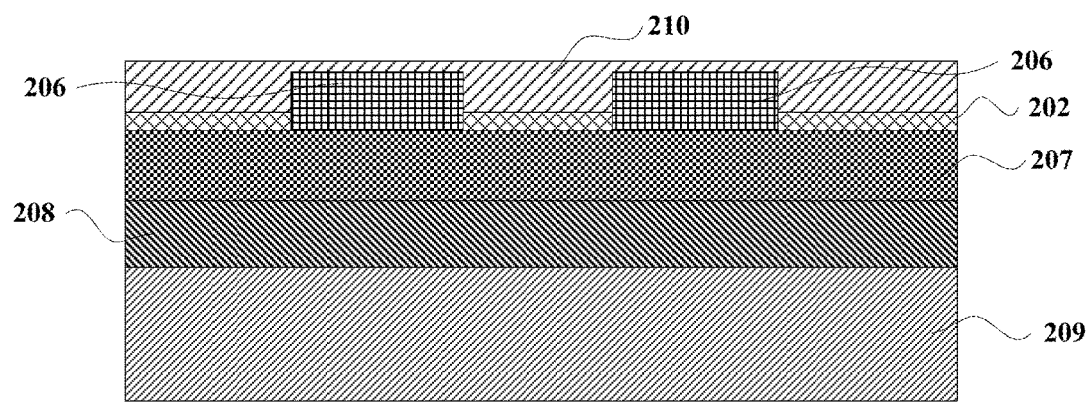
FIG. 2H is a cross-sectional view diagram illustrating a stage of the method for forming a semiconductor device according to embodiments of the present invention.
Figure 2I:
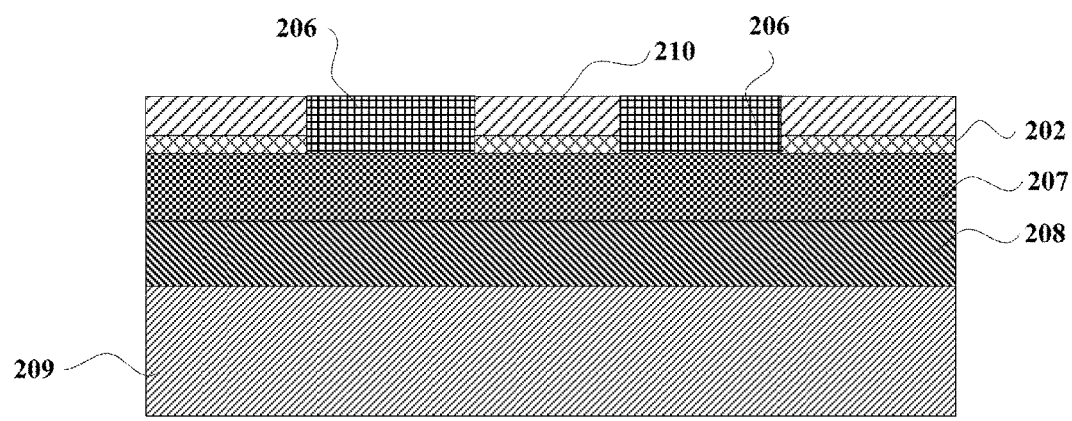
FIG. 2I is a cross-sectional view diagram illustrating a stage of the method for forming a semiconductor device according to embodiments of the present invention.

At step S17, as shown in FIG. 2H, the lower portion of the first substrate is separated at the hydrogen-implanted layer 203. FIG. 2H shows the remaining portion of the first substrate 210 with regions of the second semiconductor material 206 embedded. As shown in FIG. 2I, a portion of the remaining first substrate 210 is removed and cleaned to expose a surface of the second semiconductor material 206 in the recessed region, thereby providing a layer of the first semiconductor material 210 on the first insulator layer 202 adjacent to a layer of the second semiconductor material 206 on the first insulator layer 202. In embodiments without the first insulator layer 202, the layer of the first semiconductor material 210 and the layer of the second semiconductor material 206 are formed in adjacent regions on insulator 207. In FIG. 2I, the removal and cleaning process can use a TMAH (Tetramethylammonium Hydroxide, tetramethylammonium hydroxide) solution to remove the top silicon surface of the silicon, and then use CR cleaning and RCA cleaning to clean the silicon surface.

Thus, embodiments of the invention provide a method for forming two or more different semiconductor materials integrated on a single substrate structure. For example, two different single crystalline semiconductor materials can be formed adjacent to each other on an insulating layer. Such a substrate can be used to form a variety of devices on a single substrate structure. This will help to reduce the size of the device or circuit, and also help to reduce costs. For example, the substrate structure may be used to form RF devices, bipolar devices, and/or advanced CMOS devices, formed in Si, GaA, or SiGe. In some embodiments, different devices can be formed in the first and second semiconductor layers. For example, an RF (radio frequency) device can be formed in the first semiconductor layer (e.g., Si), and a bipolar device or Advanced CMOS semiconductor device can be formed in the second semiconductor layer (such as GaAs or SiGe).

In other embodiments, the bottom of the recess 205 (i.e., step S13) may be adjacent to and in contact with the hydrogen injection layer 203, and in the separation step (i.e., step S17), the top silicon semiconductor layer can be exposed. Therefore, the top-level silicon surface removal step and the cleaning can be omitted.

In some embodiments, the second substrate may include a silicon substrate with a polysilicon layer formed on a top surface. FIGS. 3A and 3B describe some of the manufacturing processes of the implementation of the second substrate. First, as shown in FIG. 3A, a substrate 301 is provided. For example, substrate 301 can be a silicon wafer, which can also be referred to as a handle substrate or a support substrate. As shown in FIG. 3A, a polysilicon layer 302 is deposited on silicon substrate 301. Polysilicon layer 302 can have a high resistivity. In FIG. 3B, a third insulating layer 208 is formed on the polysilicon layer 302. For example, an oxidation or deposition process can be used for forming the third insulating layer 208. The third insulating layer may be, for example, silicon dioxide. The range of thickness of the third insulation layer may be between 1000 Å to 10000 Å.

Figure 5:
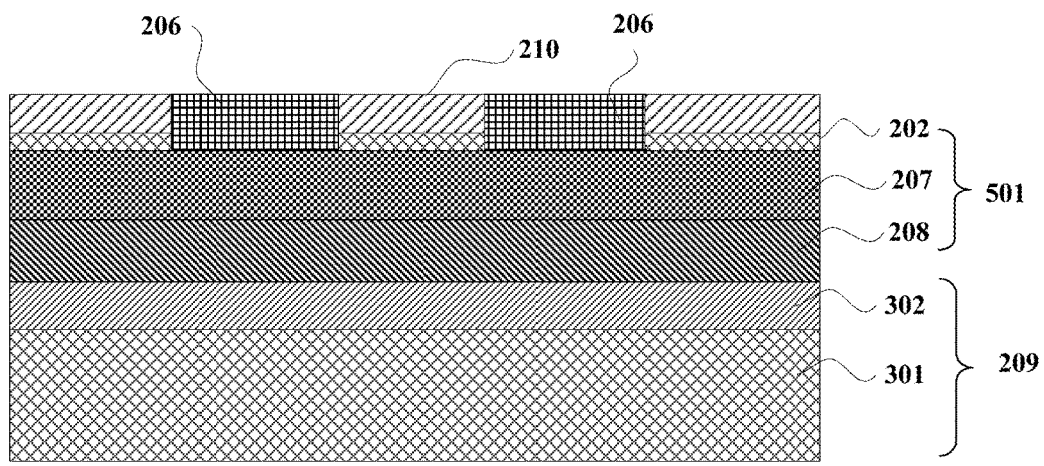
FIG. 5 is a cross-sectional view diagram illustrating a semiconductor device according to an embodiment of the present invention.

Thus, in this embodiment, a third insulating layer is formed on the second substrate. The next step is similar to the previous example: the third insulating layer and the second insulating layer are bonded; a hydrogen-implanted layer is formed as a separate layer, separating a portion of the silicon substrate to form a top silicon; and a top portion of the silicon substrate is removed by a removal and cleaning process to the exposed semiconductor layer. A detailed description of these steps is similar to the steps described above. The resultant substrate structure is shown in FIG. 5 as device structure 50.

In some embodiments, the material of the second semiconductor layer can be SiGe, or other compound semiconductor materials. A silicon cap layer can be formed on the second semiconductor layer, and a silicon cap layer can be oxidized to form a silicon dioxide layer of silicon dioxide. Then, a second insulator layer can be formed on the first insulator layer and the oxidized silicon cap layer.

Figure 4A:
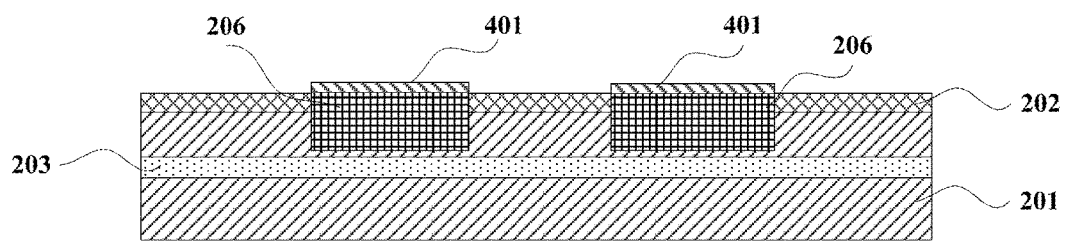
FIG. 4A is a cross-sectional view diagram illustrating a stage of the method for forming a semiconductor device according to another embodiment of the present invention.
Figure 4B:
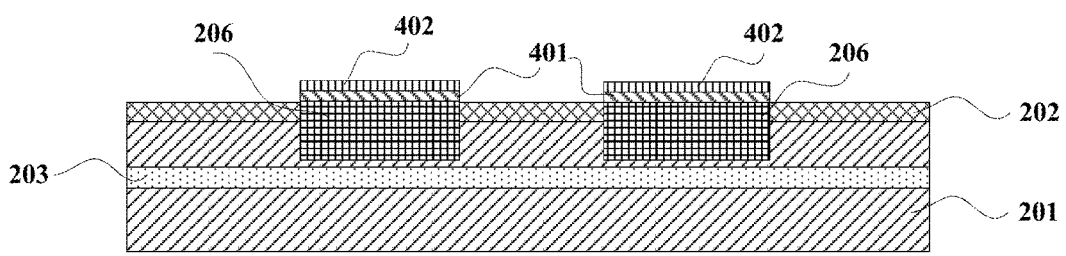
FIG. 4B is a cross-sectional view diagram illustrating a stage of the method for forming a semiconductor device according to another embodiment of the present invention.
Figure 4C:
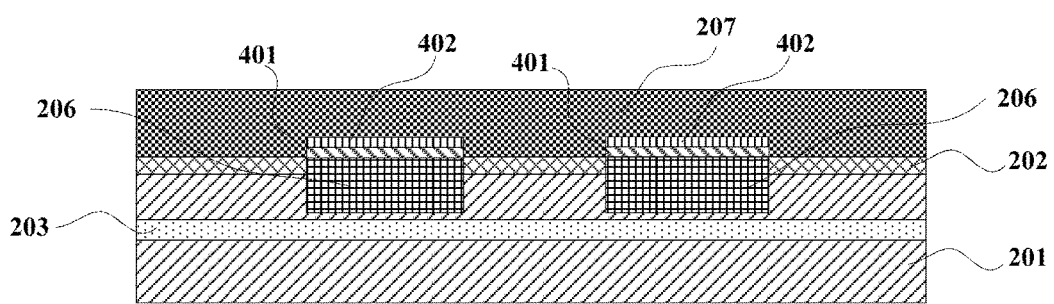
FIG. 4C is a cross-sectional view diagram illustrating a stage of the method for forming a semiconductor device according to another embodiment of the present invention.

FIGS. 4A to 4F are cross-sectional view diagrams illustrating a manufacturing process of a substrate structure according to another embodiment of the present invention. First, according to the procedures described above, such as step S11 to step S14, the structure shown in FIG. 2E is formed, in which the second semiconductor material of semiconductor layer 206 may be SiGe, GaAs, or other compound semiconductor materials. Next, as shown in FIG. 4A, for example, using a selective epitaxy process, a silicon cap layer 401 is formed on the second semiconductor layer 206. The silicon cap layer can prevent dislocations in the surface of the second semiconductor layer 206, thereby reducing defects. In some embodiments, the silicon capping layer may be formed in the same epitaxial growth process as the SiGe layer. Next, as shown in FIG. 4B, silicon cap layer 401 is oxidized to form oxide layer 402. In FIG. 4C, a second insulator layer 207 is formed on the first insulator layer 202 and oxide layer 402.

Figure 4D:
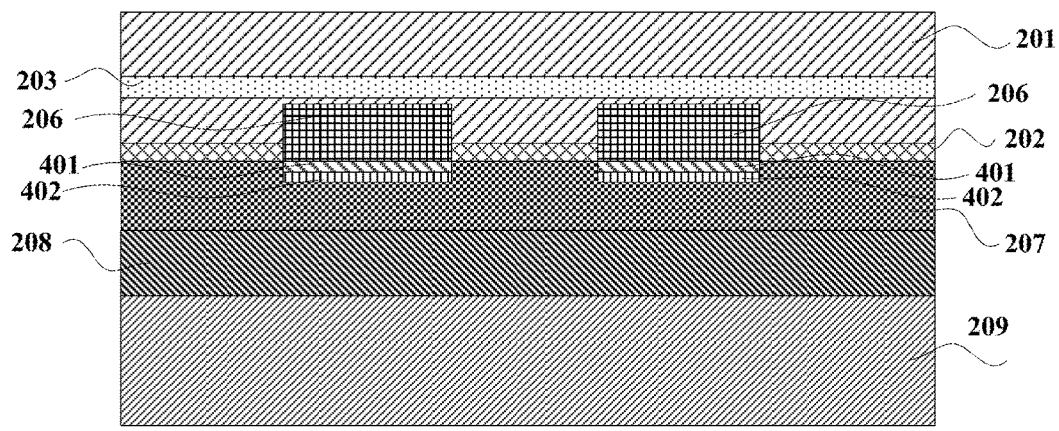
FIG. 4D is a cross-sectional view diagram illustrating a stage of the method for forming a semiconductor device according to another embodiment of the present invention.
Figure 4E:
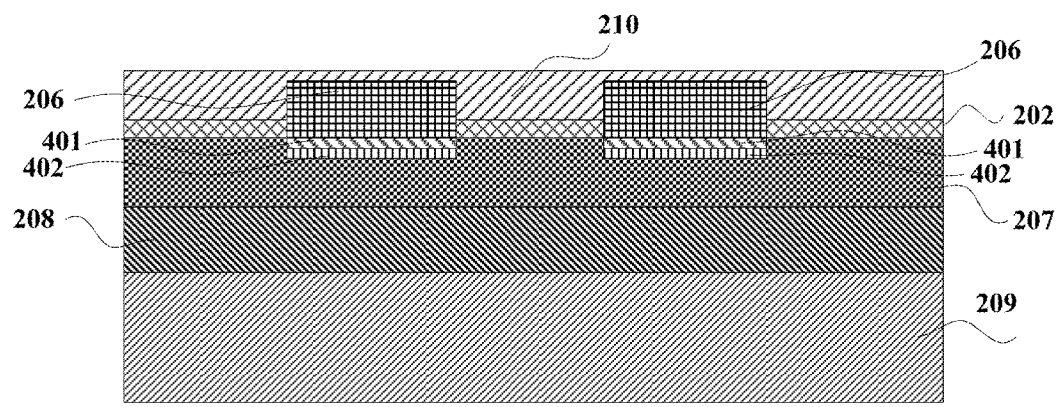
FIG. 4E is a cross-sectional view diagram illustrating a stage of the method for forming a semiconductor device according to another embodiment of the present invention.
Figure 4F:
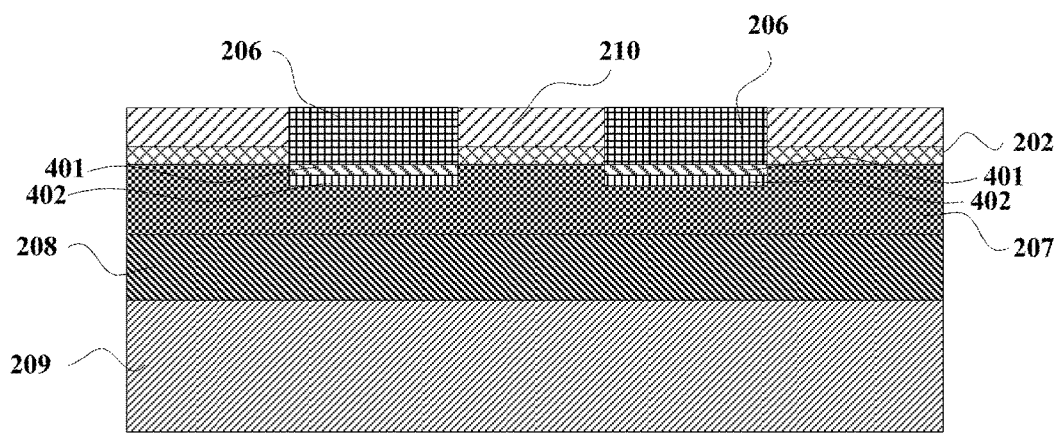
FIG. 4F is a cross-sectional view diagram illustrating a stage of the method for forming a semiconductor device according to another embodiment of the present invention.

In FIG. 4D, the third insulator layer 208 on a second substrate 209 is bonded with the second insulator layer 207. In FIG. 4E, a portion of substrate 201 is separated from the bonded structure at the hydrogen-implanted layer 203. In FIG. 4F, a surface portion of the remaining silicon 210 is removed. After cleaning, regions of the second semiconductor material 206 are exposed among silicon regions 210.

In other embodiments, the material of the second semiconductor layer is SiGe, and the second or support substrate includes a silicon substrate and a polysilicon layer located on the silicon substrate. A substrate structure 60 shown in FIG. 6 can be formed using the above-described processes for forming the support substrate and the processes for manufacturing the substrate structure with embedded SiGe. The substrate structure 60 includes a cap layer 401 located between the second semiconductor layer and the second insulator layer.

FIG. 5 is a cross-sectional view diagram illustrating a substrate structure according to an embodiment of the present invention. As shown in FIG. 5, substrate structure 50 includes a substrate 209 (illustrated above as the second substrate or support substrate), an insulator layer 501 over substrate 209, and silicon regions 210 and second semiconductor material regions 206. Second semiconductor material regions 206 are embedded in silicon regions 210. Second semiconductor material regions 206 have a different material than silicon regions 210; for example, second semiconductor material regions 206 can have GaAs, SiGe, or other semiconductor materials.

Thus, embodiments of the invention provide a method for forming two or more different semiconductor materials integrated on a single substrate structure. For example, two different single crystalline semiconductor materials can be formed adjacent to each other on an insulating layer. Such a substrate can be used to form a variety of devices on a single substrate structure. This will help to reduce the size of the device or circuit, and also help to reduce costs. For example, the substrate structure may be used to form RF devices, bipolar devices, and/or advanced CMOS devices, formed in Si, GaA, or SiGe. In some embodiments, different devices can be formed in the first and second semiconductor layers. For example, an RF (radio frequency) device can be formed in the first semiconductor layer (e.g., Si), and a bipolar device or Advanced CMOS semiconductor device can be formed in the second semiconductor layer (such as GaAs or SiGe).

In some embodiments, as shown in FIG. 5, substrate 209 can include silicon wafer 301 and a polysilicon layer 302 on silicon wafer 301. Insulator layer 501 is formed on polysilicon layer 302. In some embodiments, insulator layer 501 can include a first insulator layer 202, a second insulator layer 207, and a third insulator layer 208. These insulator layers can include insulating materials such as silicon dioxide. They can also include other insulator materials, such as silicon nitride, etc. Depending on the embodiments, each of the insulator layers can have a thickness between 1000 Å to 10000 Å.

Figure 6:
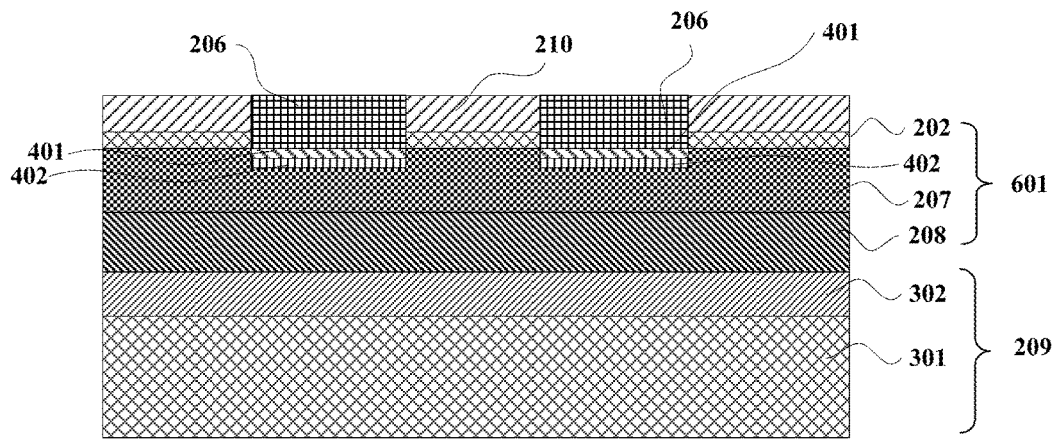
FIG. 6 is a cross-sectional view diagram illustrating a semiconductor device according to another embodiment of the present invention.

FIG. 6 is a cross-sectional view diagram illustrating a substrate structure according to an embodiment of the present invention. As shown in FIG. 6, substrate structure 60 includes a substrate 209 (illustrated above as the second substrate or support substrate), an insulator layer 601 over substrate 209, and silicon regions 210 and second semiconductor material regions 206 on insulator layer 601. Second semiconductor material regions 206 are embedded in silicon regions 210. Second semiconductor material regions 206 have a different material than silicon regions 210; for example, second semiconductor material regions 206 can have GaAs, SiGe, or other semiconductor materials. Substrate structure 60 can also include a silicon cap layer 401, which can prevent dislocations in the second semiconductor material regions and reduce defects. In some embodiments, insulator layer 601 can include a first insulator layer 202, a second insulator layer 207, a third insulator layer 208, and silicon dioxide layer 402. Insulator layers 202, 207, and 208 can include insulating materials such as silicon dioxide. They can also include other insulator materials, such as silicon nitride, etc.

Embodiments of the present invention also provide a semiconductor device, which includes a substrate structure as described above, e.g., substrate structure 50 shown in FIG. 5 or substrate structure 60 shown in FIG. 6. For example, the semiconductor device may include: RF devices formed in the silicon regions 210 and bipolar devices and/or advanced CMOS devices formed on the second semiconductor regions 206. The semiconductor device can also include other devices based on design or product needs Thus, a manufacturing method of the semiconductor device has been described in detail and according to an embodiment of the present disclosure. In order to maintain clarity of the disclosed concept, certain details known in the art are not described in detail. Those skilled in the art can understand how to implement technical solutions disclosed herein based on the above description.

Unless otherwise indicated, terms such as "first" and "second" are used to distinguish the elements described. Thus, these terms are not necessarily intended to represent the time of these elements or other order. In addition, terms such as "front," "after," "top," "bottom," "upper," and "lower" are used to describe the position in the illustrations and are not intended for describing permanent relative positions permanently.

Although certain embodiments of the present invention are described in detail, those skilled in the art will appreciate that the above examples are for illustration only and not to limit the scope of the invention. Thus, those skilled in the art would appreciate that, aside from embodiments of the present disclosure, various modifications and changes can be made without departing from the spirit and scope of the present disclosure.

What is claimed is:

1. A method of manufacturing a semiconductor substrate, the method comprising:
    forming a first insulator layer on a first substrate of a first semiconductor material;
    implanting hydrogen ions into the first substrate to form a hydrogen-implanted layer that divides the first substrate into an upper portion and a lower portion;
    after forming the hydrogen-implanted layer, removing a portion of the first insulating layer and a portion of the upper portion of the first substrate to form a recessed region in the first substrate;
    forming a second semiconductor material in the recessed region by selective epitaxial growth;
    forming a silicon cap layer on the second semiconductor layer exposing the first insulator layer;
    oxidizing a lower portion of the silicon cap layer to form a silicon dioxide layer;
    forming a second insulator layer on the first insulator layer and the silicon dioxide layer, wherein the silicon dioxide layer and the silicon cap layer are embedded in the second insulator layer;
    providing a second substrate with a third insulator layer disposed thereon;
    bonding the first substrate with the second substrate with the second insulator layer adjacent to the third insulator layer;
    removing the lower portion of the first substrate at the hydrogen-implanted layer;
    thinning a remaining portion of the upper portion of the first substrate to expose a surface of the second semiconductor material in the recessed region, thereby providing a layer of the first semiconductor material on the second insulator layer adjacent to a layer of the second semiconductor material on the second insulator layer, wherein the second semiconductor material and a remaining portion of the first insulating layer alternates alternate in a direction parallel to a surface of the second insulator.

2. The method of claim 1, wherein the recessed region is in the upper portion of the first substrate above the hydrogen-implanted layer.

3. The method of claim 1, wherein the recessed region extends into a top portion of the hydrogen-implanted layer.

4. The method of claim 1, wherein forming the recessed region comprises:
    forming a patterned photoresist layer on the first insulator layer;
    using the patterned photoresist as a mask to remove a portion of the first insulating layer and the first substrate to form the recessed region in the first substrate; and
    removing the patterned photoresist layer.

5. The method of claim 1, further comprising performing a surface cleaning treatment before forming the second semiconductor material in the recessed region by selective epitaxial growth.

6. The method of claim 5, wherein the surface cleaning treatment comprises photoresist ashing and removal, and wet cleaning steps.

7. The method of claim 1, wherein the first semiconductor material is silicon (Si) and the second semiconductor material is gallium arsenide (GaAs).

8. The method of claim 1, wherein the first semiconductor material is silicon (Si) and the second semiconductor material is silicon germanium (SiGe).

9. The method of claim 1, further comprising planarizing the second insulator layer over the second semiconductor material and the first substrate.

10. The method of claim 1, wherein providing the second substrate with the third insulator layer comprises:
    forming a polysilicon layer on the second substrate; and
    oxidizing the polysilicon layer to form the third insulator layer.

11. The method of claim 1, wherein the second semiconductor material is silicon germanium (SiGe).

12. The method of claim 1, wherein the layer of the first semiconductor material formed on the remaining portion of the second insulator layer and the second semiconductor material alternate on the surface of the second insulator.

13. A method of manufacturing a semiconductor substrate, the method comprising:
    forming a first insulator layer on a first substrate of a first semiconductor material;
    implanting hydrogen ions into the first substrate to form a hydrogen-implanted layer that divides the first substrate into an upper portion and a lower portion;
    removing a portion of the first insulating layer and a portion of the upper portion of the first substrate to form a recessed region in the first substrate;
    forming a second semiconductor material in the recessed region by selective epitaxial growth;
    forming a silicon cap layer on the second semiconductor material;
    oxidizing a portion of the silicon cap layer to form a silicon dioxide layer;
    forming a second insulator layer on the first insulator layer and the silicon dioxide layer, wherein the silicon dioxide layer and the silicon cap layer are embedded in the second insulator layer;
    providing a second substrate with a third insulator layer disposed thereon;
    bonding the first substrate with the second substrate with the second insulator layer adjacent to the third insulator layer;

thinning a remaining portion of the upper the lower portion of the first substrate at the hydrogen-implanted layer; and removing a portion of the first substrate to expose a surface of the second semiconductor material in the recessed region, thereby providing a layer of the first semiconductor material on the second insulator layer adjacent to a layer of the second semiconductor material on the second insulator layer.

14. The method of claim 13, wherein the first semiconductor material is silicon (Si) and the second semiconductor material is silicon germanium (SiGe).

15. The method of claim 13, wherein the layer of the first semiconductor material formed on the remaining portion of the second insulator layer and the second semiconductor material alternate on the surface of the second insulator.

16. The method of claim 13, wherein the recessed region is in the upper portion of the first substrate above the hydrogen-implanted layer.

17. The method of claim 13, wherein the recessed region extends into a top portion of the hydrogen-implanted layer.

18. The method of claim 13, wherein forming the recessed region comprises:

forming a patterned photoresist layer on the first insulator layer;

using the patterned photoresist as a mask to remove a portion of the first insulating layer and the first substrate to form the recessed region in the first substrate; and removing the patterned photoresist layer.

19. The method of claim 13, further comprising performing a surface cleaning treatment before forming the second semiconductor material in the recessed region by selective epitaxial growth.

20. The method of claim 19, wherein the surface cleaning treatment comprises photoresist ashing and removal, and wet cleaning steps.

* * * * *